United States Patent [19]

Freymuth

[11] Patent Number: 5,130,562
[45] Date of Patent: Jul. 14, 1992

[54] INTEGRATED POWER-SENSE CIRCUIT

[75] Inventor: Christopher A. Freymuth, Austin, Tex.

[73] Assignee: Advanced Micro Devices, Inc., Sunnyvale, Calif.

[21] Appl. No.: 576,682

[22] Filed: Aug. 31, 1990

[51] Int. Cl.$^5$ .............................................. H02J 7/34
[52] U.S. Cl. ....................................... 307/66; 307/150
[58] Field of Search ............................ 307/150, 43–46, 307/64–66, 85–87; 365/226–229; 371/66; 340/636; 364/185, 186, 707

[56] References Cited

U.S. PATENT DOCUMENTS

| | | | |
|---|---|---|---|
| 4,143,283 | 3/1979 | Graf et al. ......................... | 307/66 X |
| 4,366,560 | 12/1982 | McDermott et al. ................. | 365/228 |
| 4,451,742 | 5/1984 | Aswell ................................ | 307/66 |
| 4,463,270 | 7/1984 | Gordon ............................. | 365/229 X |
| 4,645,943 | 2/1987 | Smith, Jr. et al. .................. | 307/150 |
| 4,712,196 | 12/1987 | Uesugi ............................... | 307/66 X |
| 4,777,626 | 10/1988 | Matsushita et al. ............. | 307/150 X |
| 4,914,316 | 4/1990 | Rossi et al. ....................... | 365/229 X |

Primary Examiner—A. D. Pellinen
Assistant Examiner—Fritz Fleming
Attorney, Agent, or Firm—Foley & Lardner

[57] ABSTRACT

A power-sense circuit for use in an integrated circuit provides an indication when back-up battery power is lost when the integrated circuit main power supply was off. The power-sense circuit is fully integrated within the integrated circuit and includes a battery sensor, a main power sensor, a latch, and an output coupled to the latch which provides a power-sense signal which is at a first binary state when back-up battery power had been lost and a second binary state indicating that main power had been reinstated to the integrated circuit.

15 Claims, 1 Drawing Sheet

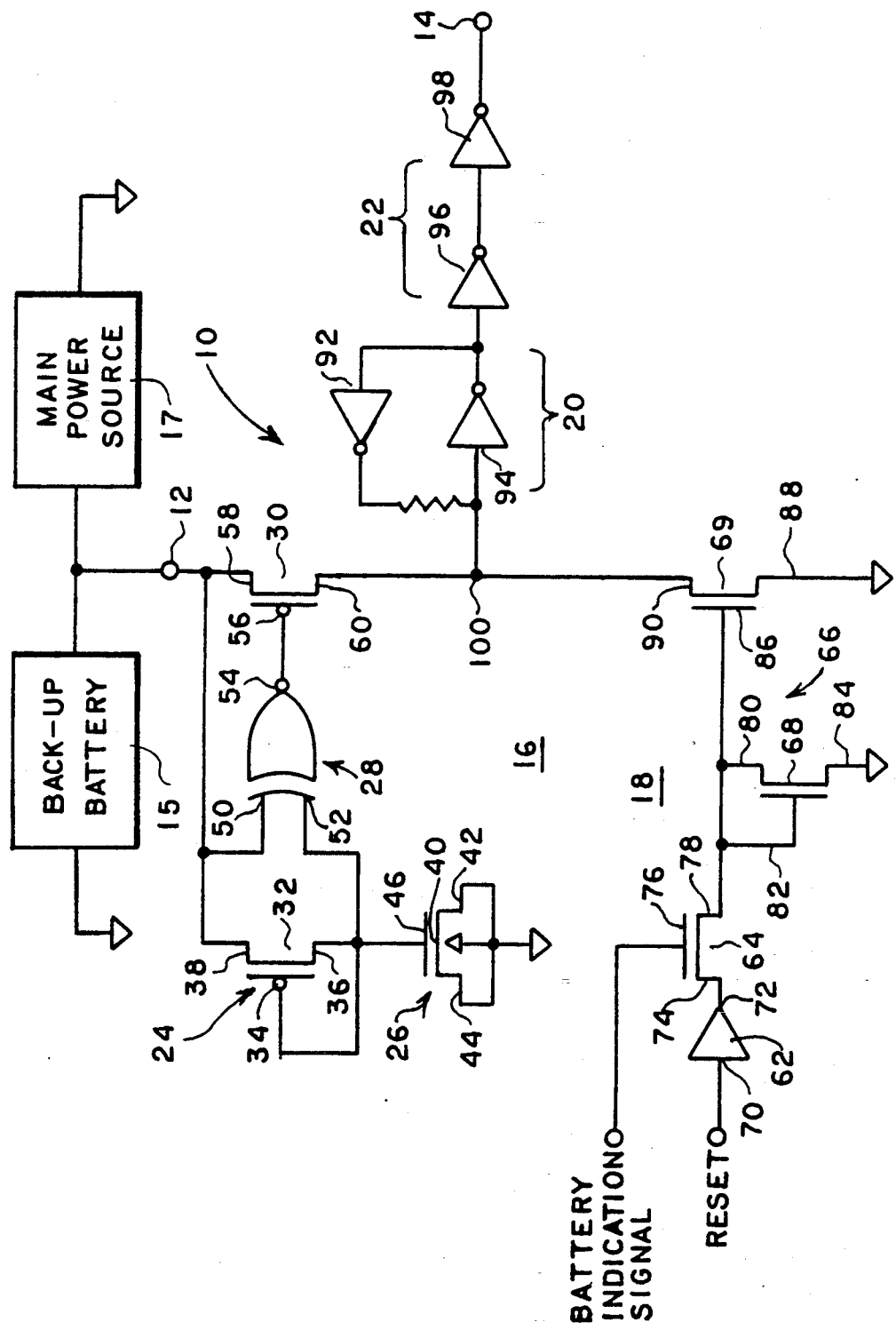

INTEGRATED POWER-SENSE CIRCUIT

BACKGROUND OF THE INVENTION

The present invention generally relates to power-sense circuit for sensing the loss of back-up battery power when a main supply source is off. The present invention more particularly relates to such a power-sense circuit which is fully integrated and which, in addition to indicating the loss of back-up battery power, also provides an unambiguous indication that battery power was lost and that the main power source has not yet be reinstated.

Many systems require certain functions to remain operational when system power is turned off. These circuits require a battery back-up system and a circuit that detects if battery power is lost while the system main power source is off. One such application is in integrated circuits including central processing units. In such integrated circuits, real time clocks must be maintained by back-up battery power when the main power is off in order to avoid corruption of date and time information.

In the prior art, power-sense circuits have been traditionally implemented with discrete components including an external resistor and capacitor in series relation and external diodes for coupling the battery and the main power source to the integrated circuit. Such prior art implementations have also included a power-sense input to the integrated circuit which is coupled to the common junction of the external resistor and capacitor. When power is applied to such circuits, the voltage at the power-sense input will be delayed by the resistor and capacitor combination. This delay insures that the power-sense input will be low for some time after power is applied before it goes high. The integrated circuit samples the power-sense input and if the input is low while power is applied to the integrated circuit, the circuit sets a flag indicating that the integrated circuit had lost back-up battery power. Once the main power source is on and a battery is installed, the capacitor will store enough charge so that when the main power source is turned off, the battery will maintain the charge on the capacitor and also power the circuit. As a result, the power-sense input will remain high while the circuit is powered by the back-up battery.

While such implementations have been successful, they have required external components. Such external components require additional tooling to use them, thus increasing the cost of the system in which they are used. In addition, prior arrangements, in general, have required the entire integrated circuit to be back-up by a battery. As more functions are integrated onto a single integrated circuit, the lifetime of a battery decreases when the entire integrated circuit is battery backed-up.

The present invention overcomes the above disadvantages with prior art arrangements. By integrating the power-sense circuit, it is possible to back-up only a small portion of the integrated circuit, thus increasing the battery lifetime and reducing the tooling costs. These factors are particularly important with respect to large-scale integrated circuits.

SUMMARY OF THE INVENTION

The present invention provides a power-sense circuit for use in a system which requires back-up battery power from a battery for at least a portion of the system when the system main power supply is off. The power-sense circuit includes a power terminal adapted to be coupled to the battery and the main power supply, an output for providing a power-sense signal having a first binary state or a second binary state, battery sense means coupled to the power terminal and responsive to the loss of the back-up battery power while the main power is off and to the reinstatement of power to the system for providing the output with the first binary state, and main power sense means responsive to a system reset signal and to a battery indication signal indicating that the system power is reinstated by the main power for maintaining the first binary state at the output for a discrete time duration and thereafter providing the output with a continuous second binary state.

The present invention further provides a power-sense circuit integrated within an integrated circuit which requires back-up battery power from a battery for at least a portion of the integrated circuit when the circuit main power supply is off. The power-sense circuit includes a power terminal adapted to be coupled to the battery and to the main supply, an output for providing a power-sense signal having a first binary state or a second binary state, and battery sense means coupled to the power terminal and responsive to the loss of the back-up battery power while the main supply is off and to the reinstatement of power to the integrated circuit for providing an intermediate control signal to provide the output with the first binary state. The power sense circuit further includes latch means coupled to the main battery sense means for latching the intermediate control signal and main power sense means for sensing the reinstatement of main power to the integrated circuit for resetting the latch means to provide the output with the second binary state.

BRIEF DESCRIPTION OF THE DRAWING

The features of the present invention which are believed to be novel are set forth with particularity in the appended claims. The invention, together with further objects and advantages thereof, may best be understood by making reference to the following description taken into conjunction with the accompanying drawing, in the sole figure of which like reference numerals identify identical elements, and wherein the sole figure is a schematic circuit diagram of an integrated power-sense circuit embodying the present invention.

DETAILED DESCRIPTION OF THE PREFERRED EMBODIMENT

Referring now to the sole figure, it illustrates a power-sense circuit 10 embodying the present invention. The power-sense circuit 10 is preferably integrated within an integrated circuit to serve to sense for the loss of back-up battery power when the integrated circuit main power is off. The circuit 10 generally includes a power terminal 12, an output 14, a battery sensing means 16, a main power sensing means 18, a latch means 20, and a buffering means 22.

The power terminal 12 is adapted to be coupled to both the main power source 17 and the back-up battery power source 15. The battery sensing means 16 includes a resistance means 24, a capacitance means 26, an exclusive NOR gate 28, and a P-Channel field-effect transistor 30. The resistance means 24 is formed by a P-Channel field-effect transistor of the type which includes a long channel. The gate 34 of transistor 32 is coupled to the drain 36 and the source 38 of transistor 32 is coupled to the power supply terminal 12.

The capacitance means 26 is formed by an N-Channel field-effect transistor 40. The source 42 and drain 44 of transistor 40 are coupled together and to ground potential. The gate 46 of transistor 40 is coupled to the common junction of the source 36 and gate 34 of transistor 32.

Exclusive NOR gate 28 includes a first input 50 which is coupled to the power supply terminal 12 and a second input 52 which is coupled to the common junction of the capacitance means 26 and the resistance means 24. The exclusive NOR gate 28 also has an output 54 which is coupled to the gate 56 of the P-Channel field-effect transistor 30. The source 58 of field-effect transistor 30 is coupled to the power supply terminal 12 and the drain 60 of field-effect transistor 30 is coupled to the latch means 20.

The main power sensing means 18 includes a noninverting amplifier 62, a first N-Channel field-effect transistor 64, a resistance means 66 formed by a second N-Channel field-effect transistor 68, and a third N-Channel field-effect transistor 69. The amplifier 62 includes an input 70 adapted to be coupled to a reset signal source of the integrated circuit. Such reset signal sources are well known in the art and provide, upon the application of main power to the integrated circuit, reset signals including a power-good signal having a low voltage level for a discrete or finite period of time followed by a transition to a continuously high voltage level when reset is complete.

The output 72 of amplifier 62 is coupled to the drain 74 of field-effect transistor 64. The gate 76 of field-effect transistor 64 is coupled to a battery indication source of the type well known in the art. Such battery indication sources provide a low voltage level indicating that the integrated circuit is being powered by the back-up battery and a high voltage level when the integrated circuit is powered by the integrated circuit main power source.

The source 78 of field-effect transistor 64 is coupled to the drain 80 and the gate 82 of the field-effect transistor 68. The source 84 of field-effect transistor 68 is coupled to ground potential. Transistor 68 is also of the type which has a long channel to serve as a resistance means between its drain 80 and its source 84.

Field-effect transistor 69 includes a gate 86 which is coupled to the drain 80 and gate 82 of field-effect transistor 68 and to the source 78 of field-effect transistor 64. Transistor 69 also includes a source 88 coupled to ground and a drain 90 which is coupled to the latch means 20.

The latch means 20 comprises a pair of inverters, inverter 92 and inverter 94. The inverters 92 and 94 are coupled in parallel but in reversed directions to form a latch of a type well known in the art.

The buffering means 22 comprises an inverter 96 and an inverter 98. The inverters 96 and 98 are coupled in series relation between the latch means 20 and the output 14.

The power-sense circuit 10 is arranged to provide at the output 14 a power-sense signal having a first binary state or a second binary state. The first binary state indicates that the back-up battery power was lost at a time in which the main power of the integrated circuit was off. The first binary state, in accordance with this preferred embodiment, is a low voltage level, and appears at the output 14 when power is reinstated to the integrated circuit. The second binary state, in accordance with this preferred embodiment, is a high voltage level which appears at the output 14 when main power has been reinstated to the integrated circuit after having lost the back-up battery power or when the integrated circuit is operating off of battery back-up power and had not lost battery back-up power since the main power was turned off.

If during the time that the main power supply is turned off, the integrated circuit loses battery back-up power, and when power is reinstated to the integrated circuit by a back up battery, the input 50 of exclusive NOR gate 28 will be at a high voltage level and input 52 will initially be at a low voltage level. This causes the output 54 of exclusive NOR gate 28 to be low, causing field-effect transistor 30 to conduct. The conduction of field-effect transistor 30 causes a high voltage level intermediate control signal to appear at node 100. The high voltage level at node 100 is maintained by the latch 20 and will provide the low voltage level first binary state at the output 14.

When the capacitance means 26 charges sufficiently, input 52 of exclusive NOR gate 28 will be at a high voltage level along with input 50. This will cause output 54 of exclusive NOR gate 28 to go high to turn off transistor 30. Even though transistor 30 is turned off, node 100 will be latched to a high voltage level by the latch means 20.

Hence, if power to the integrated circuit is restored by reinstatement of back-up battery power, the first binary state low voltage level will be maintained continuously at output 14.

If after losing back-up battery power during a time in which the main power source was turned off, and if power is reinstated to the integrated circuit by the main power source instead of a back-up battery source, the first binary state at output 14 will remain for a discrete or finite period of time after power is restored and then the second binary state will appear at output 14. When power is applied to the integrated circuit by the main power source, the battery indication signal applied to gate 76 will go high. The power-good signal applied to the input 70 of the amplifier 62 will initially be low such that field-effect transistor 64 is not conducting and therefore field-effect transistor 69 is not conducting. This will permit node 100 to remain at a high level and to maintain the first binary state at output 14.

When the power-good signal applied to input 70 goes high, transistor 64 will turn on, and in turn, turn on transistor 69. With transistor 69 turned on, the node 100 will be pulled to ground potential causing the latch means 20 to be reset to provide the second binary state at output 14 which, as previously mentioned, in accordance with this preferred embodiment, is a high voltage level. During the time in which the output 14 was at the low voltage level first binary state, a bit may be set in an internal register of the integrated circuit to indicate that battery power had been lost while the main power supply was off.

With a new back-up battery installed, if the main power supply is turned off, the inputs 50 and 52 of exclusive NOR gate 28 will remain at the same potential to preclude transistor 30 from turning on and pulling node 100 to a high voltage level. The gate 76 of transistor 64 will switch to a low voltage level to turn transistor 64 off. This allows the resistance means comprising field-effect transistor 68 to pull the gate 86 of transistor 69 to ground potential. This insures that transistor 69 is turned off and that therefore, node 100 will remain at the latched low voltage level that it had attained when the main power source was on.

When the main power is reapplied to the integrated circuit, the battery indication signal at gate 76 of filed-effect transistor 64 will go to a high level, inputs 50 and 52 of exclusive NOR gate 28 will remain at the same potential, and, therefore, node 100 will remain at its low voltage level maintained by the latch means 20. When the power-good signal applied to input 70 of amplifier 62 goes to a high level, since node 100 is already at a low voltage level, the power-sense signal at output 14 will remain at the high voltage level second binary state throughout power-down and power-up.

While a particular embodiment of the present invention has been shown and described, modifications may be made, and it is therefore intended to cover in the appended claims such changes and modifications which fall within the true spirit and scope of the invention.

What is claimed is:

1. A power-sense circuit for use in a system which is provided with system power from a main power supply and from back-up battery power from a battery for at least a portion of said system when said main power supply is off, said power-sense circuit comprising:
   a power terminal adapted to be coupled to said battery and said main power supply;
   an output for providing a power-sense signal having a first binary state or a second binary state;
   battery sense means coupled to said power terminal and responsive to the loss of said back-up battery power while said main power supply is off and to the reinstatement of power to said system for providing said output with said first binary state;
   main power sense means responsive to a reset signal and to a battery indication signal indicating that said system power is reinstated by said main power supply for maintaining said first binary state at said output for a discrete time duration and thereafter providing said output with a continuous said second binary state; and
   means for providing said output with a continuous said first binary state responsive to said battery sense means when said system power is reinstated by said back-up battery power after the loss of said back-up battery power while said main power supply is off and before said system power is reinstated by said main power supply.

2. A power-sense circuit as defined in claim 1 wherein said means for providing said output with said continuous said first binary state comprises a latch.

3. A power-sense circuit as defined in claim 2 wherein said main power sense means is coupled to said latch for resetting said latch for providing said second binary state at said output after said main power supply is applied to said system.

4. A power-sense circuit as defined in claim 3 wherein said battery sense means and said main power sense means are implemented in a single integrated circuit device.

5. A power-sense circuit as defined in claim 4 wherein said latch includes an input, and wherein said battery sense means comprises a resistance means and a capacitance means series coupled between said power terminal and common potential, an exclusive NOR gate having a first input coupled to said power terminal, a second input coupled between said resistance means and said capacitance means, and an output, and field-effect transistor having a gate coupled to said exclusive NOR gate output, a source coupled to said power terminal, and a drain coupled to the input of said latch.

6. A power-sense circuit as defined in claim 5 wherein said latch comprises a pair of parallel reverse coupled inverters.

7. A power-sense circuit as defined in claim 6 further including buffering means coupled between said latch and said output.

8. A power-sense circuit as defined in claim 7 wherein said main power sense main comprises a first field-effect transistor having a gate coupled to said battery indication signal, a drain coupled to said reset signal, and a source, a second field-effect transistor having a gate and drain coupled together and to said first field-effect transistor source and a source coupled to common potential, and a third field-effect transistor having a source coupled to common potential, a gate coupled to said first field-effect transistor source, and a drain coupled to the input of said latch.

9. A power-sense circuit integrated within an integrated circuit which requires back-up battery power from a battery for at least a portion of said integrated circuit when the main power supply is off, said power-sense circuit comprising:
   a power terminal adapted to be coupled to said battery and to said main power supply;
   an output for providing a power-sense signal having a first binary state or a second binary state;
   battery sense means coupled to aid power terminal and responsive to the loss of said back-up battery power while said main power supply is off and to the reinstatement of power to said integrated circuit for providing an intermediate control signal to provide said output with said first binary state;
   latch means coupled to said battery sense means for latching said intermediate control signal, said latch means providing said output with a continuous said first binary state responsive to said intermediate control signal when power to said integrated circuit is reinstated by said back-up battery power; and
   main power sense means for sensing the reinstatement of power to said integrated circuit by said main power supply for resetting said latch to provide said output with said second binary state.

10. A power-sense circuit as defined in claim 9 wherein said main power sense means is responsive to a reset signal for resetting said latch means a discrete time period after said main power supply is applied to said integrated circuit.

11. A power-sense circuit as defined in claim 10 wherein said main power sense means is also responsive to a battery indication signal indicating that said integrated circuit is being powered by said main power supply.

12. A power-sense circuit as defined in claim 9 wherein said latch means comprises a pair of parallel reverse coupled inverters.

13. A power-sense circuit as defined in claim 12 further including buffering means coupled between said latch and said output.

14. A power-sense circuit as defined in claim 9 wherein said latch includes an input and wherein said battery sense means comprises a resistance means and a capacitance means series coupled between said power terminal and common potential, an exclusive NOR gate having a first input coupled to said power terminal, a second input coupled between said resistance means and said capacitance means, and an output, and a field-effect transistor having a gate coupled to said exclusive NOR gate output, a source coupled to said power terminal, and a drain coupled to the input of said latch.

15. A power-sense circuit as defined in claim 11 wherein said main power sense means comprises a first field-effect transistor having a gate coupled to said battery indication signal, a drain coupled to said reset signal, and a source, a second field-effect transistor having a gate and drain coupled together and to said first field-effect transistor source and a source coupled to common potential, and a third field-effect transistor having a source coupled to common potential, a gate coupled to said first field-effect transistor source, and a drain coupled to the input of said latch.

* * * * *